(12) United States Patent
Kwon et al.

(10) Patent No.: US 6,903,671 B2
(45) Date of Patent: Jun. 7, 2005

(54) DIGITAL-TO-ANALOG CONVERTER WITH LOW SKEW AND GLITCH

(75) Inventors: Dae-hoon Kwon, Seoul (KR); Gae-ok Cho, Gyeonggi-do (KR); Jae-jun Moon, Seoul (JP)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/762,510

(22) Filed: Jan. 23, 2004

(65) Prior Publication Data

US 2004/0150542 A1 Aug. 5, 2004

(30) Foreign Application Priority Data

Jan. 23, 2003 (KR) .................................. 10-2003-0004627

(51) Int. Cl.[7] .............................................. H03M 1/00
(52) U.S. Cl. ..................................... 341/136; 341/144
(58) Field of Search ................................ 341/136, 133, 341/153, 144

(56) References Cited

U.S. PATENT DOCUMENTS

| | | | | |
|---|---|---|---|---|
| 6,218,974 B1 | * | 4/2001 | Dedic | 341/144 |
| 6,344,816 B1 | * | 2/2002 | Dedic | 341/144 |
| RE37,619 E | * | 4/2002 | Mercer et al. | 341/133 |
| 6,369,734 B2 | * | 4/2002 | Volk | 341/144 |
| 6,417,793 B1 | * | 7/2002 | Bugeja et al. | 341/144 |
| 6,496,132 B2 | * | 12/2002 | Volk | 341/153 |
| 6,639,534 B2 | * | 10/2003 | Khoini-Poorfard et al. | 341/144 |

* cited by examiner

*Primary Examiner*—Jean Bruner Jeanglaude
(74) *Attorney, Agent, or Firm*—Sughrue Mion, PLLC

(57) ABSTRACT

Disclosed is a digital-to-analog (D/A) converter with low skew and glitches. The D/A converter has current cells each outputting a different current amount and current switches selectively enabling the current cells, and obtains an analog signal from voltages corresponding to output currents of the current cells by operating the current switches, characterized in that the current switches are each provided with MOS transistors each having an adjusted aspect ratio so as to have a constant capacitance load regardless of the output current amounts from the current cells. In such a D/A converter, parasitic capacitances of MOS transistors provided in the current switches are adjusted constant regardless of output current amounts, so that the D/A converter can operate at a high speed with low skew and glitch.

7 Claims, 12 Drawing Sheets

DIGITAL-TO-ANALOG CONVERTER WITH LOW SKEW AND GLITCH

CROSS-REFERENCE TO RELATED APPLICATIONS

This application claims the benefit of Korean Patent Application No. 2003-04627, dated Jan. 23, 2003, in the Korean Intellectual Property Office, the disclosure of which is incorporated herein by reference.

BACKGROUND OF THE INVENTION

1. Field of the Invention

The present invention relates to a digital-to-analog (D/A) converter, and more particularly to a D/A converter with low skew and glitches.

2. Description of the Related Art

In general, the D/A conversion is carried out by obtaining voltage values corresponding to sums of currents outputted from plural output sources controlled by switches that are turned on and off by a digital signal. At this time, the individual current sources have a different output current amount respectively based on a weighted value of a digital signal. For example, in a 4-bit D/A converter, currents outputted from current sources corresponding to the Least Significant Bit (LSB) and the Most Significant Bit (MSB) are at least two times or more different in amount. Upon switching the current sources having such differences in current amount, the larger current amounts the current sources produce, the slower their switching response speeds become. In order to solve the problem, the large current sources producing large current amounts should have a low internal resistance. Accordingly, as the number of current sources constituting a D/A converter increases, the turn-on resistance of switches switching on and off current sources for the MSBs should become lower.

Figure 1:
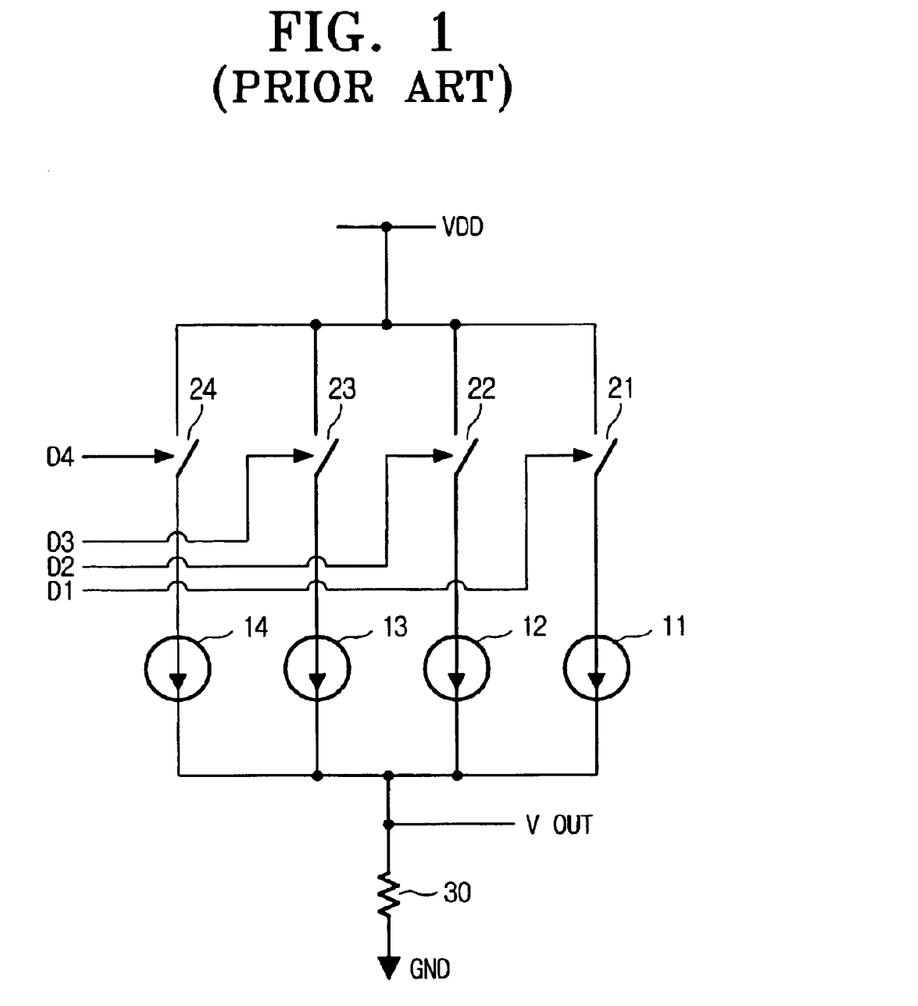
FIG. 1 is a view for explaining an operation principle of a D/A converter.

FIG. 1 is a view for explaining an operation principle of a D/A converter.

The D/A converter shown in FIG. 1 is conceptually directed to a 4-bit D/A converter which has current cells 11, 12, 13, and 14, current switches 21, 22, 23, and 24, and a load resistor 30.

The current cells 11 to 14 each have a different current output amount based on weights thereof. For example, the current cells 11 to 14 output current amounts of 10 mA, 20 mA, 30 mA, and 40 mA, respectively. The current switches 21 to 24 respond to digital signals D1, D2, D3, and D4, and selectively enable the current cells 11 to 14. The enabled current switches 21 to 24 provides paths between the current cells 11 to 14 and a drive voltage VDD, to thereby apply certain output currents of the current cells 11 to 14 to the resistor 30. The currents applied to the resistor 30 are converted into certain voltage signals as outputs through the resistor 30. That is, the digital signals D1 to D4 are converted into an analog signal.

Figure 2:
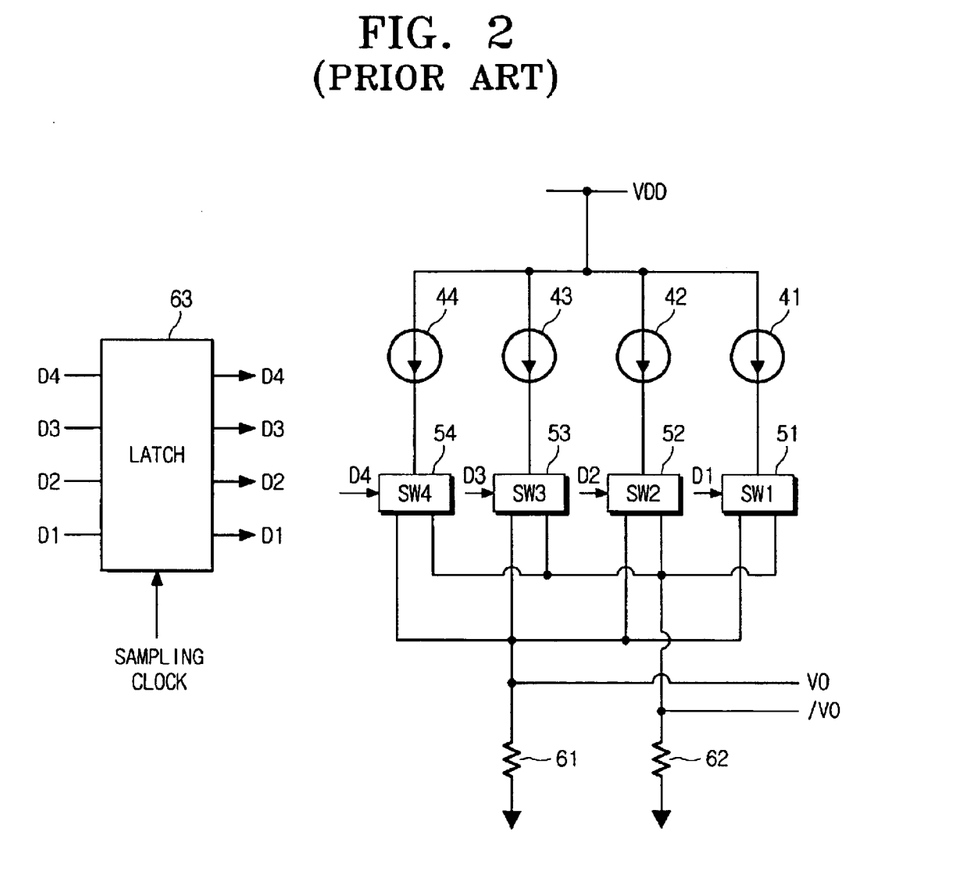
FIG. 2 is a block diagram for conceptually showing a conventional D/A converter.

FIG. 2 is a block diagram for conceptually showing a conventional D/A converter.

The D/A converter shown in FIG. 2 is conceptually directed to a 4-bit D/A converter that has current cells 41, 42, 43, and 44, current switches 51, 52, 53, and 54, load resistors 61 and 62, and a latch 63.

The current cells 41 to 44 input a drive voltage VDD and output a certain current, respectively. The individual current cells 41 to 44 output a different current amount, respectively, based on their different weights.

The current switches 51 to 54 respond to digital signals D1 to D4 and selectively enable the current cells 41 to 44. In here, the current switches 51 to 54 respond to the digital signals D1 to D4, and then enable the current cells 41 to 44 to differentially output currents in the inverse and non-inverse manners. Accordingly, the currents generated from the current cells 41 to 44 flow through paths formed between the drive voltage VDD and the ground voltage GND all the time. As such, by keeping the current cells 41 to 44 turned on by the current switches 51 to 54 all the time, the chances of glitches occurring when a D/A converter performs D/A conversions are somewhat reduced, which is later described in detail.

Figure 3A:
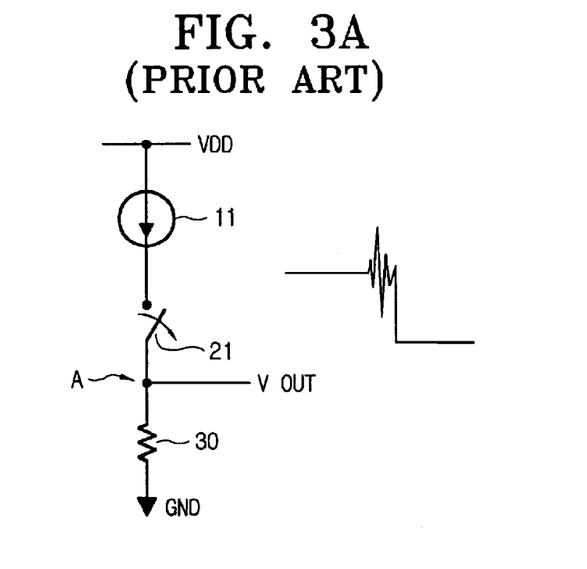
FIG. 3A and FIG. 3B are views for conceptually explaining glitch occurrences due to current switches shown in FIG. 1 and FIG. 2.
Figure 3B:
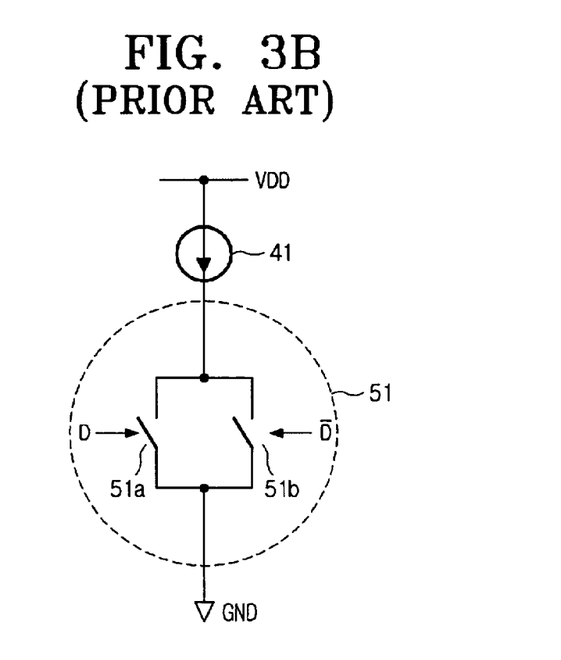

FIG. 3A and FIG. 3B are views for conceptually explaining glitch occurrences due to the current switches shown in FIG. 1 and FIG. 2.

FIG. 3A is for explaining glitch occurrences when the current switches of FIG. 1, for example, a reference numeral 21, are turned off. FIG. 3A shows that, when a current path is cut off while a current source 11 applies a current to the ground voltage GND, a glitch occurs due to a phenomenon for recovering a voltage of node A up to the drive voltage VDD.

FIG. 3B is a view for conceptually showing the current switches of FIG. 2, for example, a reference numeral 51, in detail. As shown in FIG. 3B, the current switch 51 differentially operates by a digital signal D and its inverse digital signal /D. When the digital signal D is in logic "high", a switch 51a electrically connects the current source 41 and the ground GND, and, when the digital signal D is in logic "low", a switch 51b electrically connects the current source 41 and the ground GND. Accordingly, the current switch 51 shown in FIG. 3B reduces glitches greatly compared to the current switch of FIG. 3A.

Figure 4:
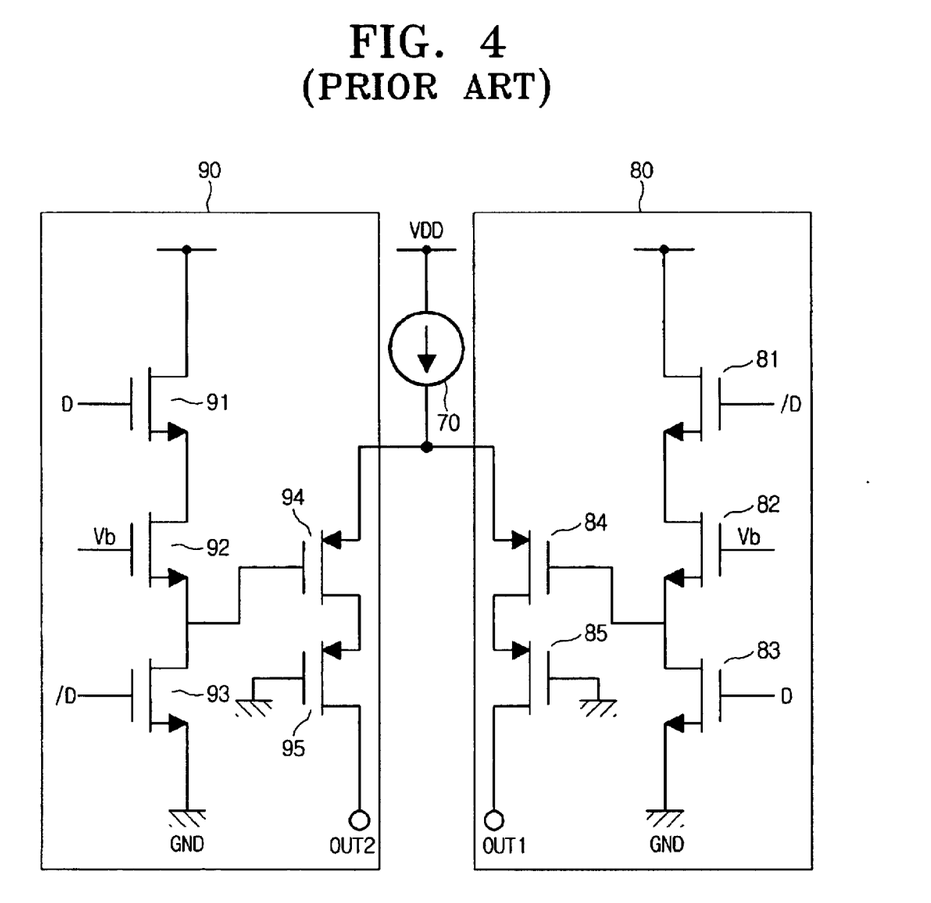
FIG. 4 is a detailed view for showing unit current switches and unit current sources for a D/A converter constituted based on the concept of the current switches shown in FIG. 3B.

FIG. 4 is a detailed circuit for showing a unit current switch and a unit current source for a D/A converter constructed based on the concept of the current switch shown in FIG. 3B.

The unit current switch shown in FIG. 4 has a first switching part 80 and a second switching part 90.

The first switching part 80 responds to the digital signal D and then outputs a current of the current source 70 to a first output terminal out1, and the second switching part 90 responds to the inverse digital signal /D and outputs the current of the current source 70 to a second output terminal out2. Accordingly, the first and second switching parts 80 and 90 alternately operate so as to output the current of the current source 70 to the first and second output terminals out 1 and out 2.

The first switching part 80 turns on a PMOS transistor 84 when the digital signal D is in logic "high", so that the current of the current source 70 is outputted to the first output terminal out 1. Likewise, the second switching part 90 turns on a PMOS transistor 94 when the inverse digital signal /D is in logic "high", so that the current of the current source 70 is outputted to the second output terminal out 2. At this time, NMOSs 81 and 82 of the first switching part 80 apply to the PMOS transistor 84 a voltage Vb applied to the gate of the NMOS 82, when the digital signal D is in logic "low", in order for the current of the current source 70 not to be applied to the first output terminal out1 through the PMOS transistor 84. The NMOS transistor 81 is a switch turned on and off by the inverse digital signal /D, and the NMOS transistor 82 limits a source voltage of an NMOS transistor 81 to the gate voltage Vb, and applies the source voltage of an NMOS transistor 81 to the PMOS transistor 84. Therefore, a range of voltages applied to the PMOS transistor 84 becomes somewhat lowered by the voltage Vb, so that an absolute voltage value of glitch occurring at the first output terminal becomes lowered. The operations of the second switching part 90 are the same as those of the first switching part 80 except to drive the second output terminal out2 by the inverse digital signal /D, so the operations of the second switching part 90 will be omitted.

In the meantime, the unit current switch lowers its response speed as the current of the current source 70 increases in amount. In order to solve the problem of lowering its response speed, the internal resistance of a current switch providing a large current should be smaller than that of a current switch providing a small current. This means that, since the unit current switch corresponding to the MSB drives the largest current amount and the unit current switch corresponding to the LSB drives the smallest current amount when a D/A converter is constructed with the unit current switches as above, the D/A converter is designed to have the unit current switches each having a different turn-on resistance value depending upon current amounts respectively driven by the unit current switches. If the unit current switches for switching on and off the current sources have the same turn-on resistance regardless of the output current amounts of the current sources, the currents from the individual current sources reach the output terminal in different times, which causes the time skew.

FIG. 5A to FIG. 5D are cross-sectioned views for showing a process for forming a PMOS transistor, for example, a reference number 84 or 94, constituting a unit current switch when the unit current switch shown in FIG. 4 is applied to a 4-bit D/A converter.

Figure 5A:
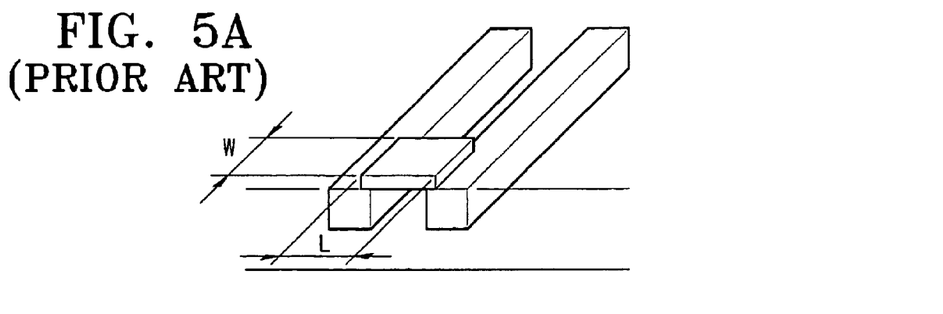
FIG. 5A to FIG. 5D are cross-sectioned views for showing a process for a PMOS transistor constituting a unit current switch when the unit current switch shown in FIG. 4 is applied to a 4-bit D/A converter.
Figure 5B:
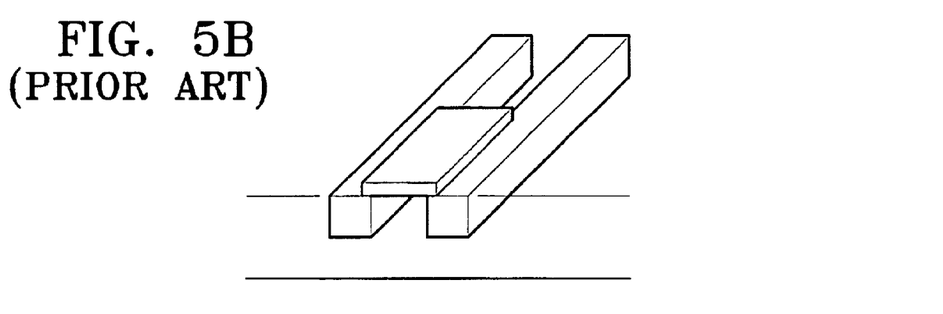
Figure 5C:
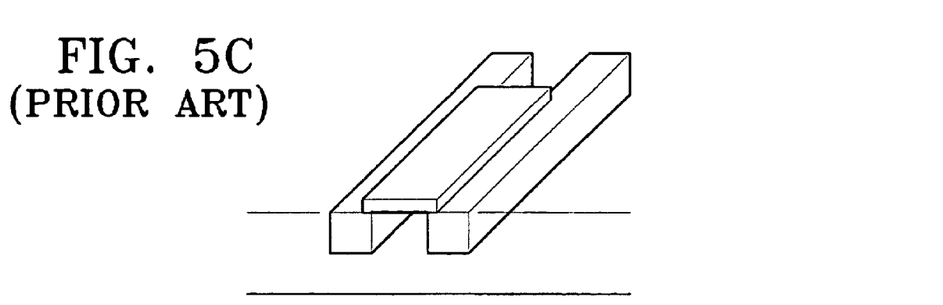
Figure 5D:
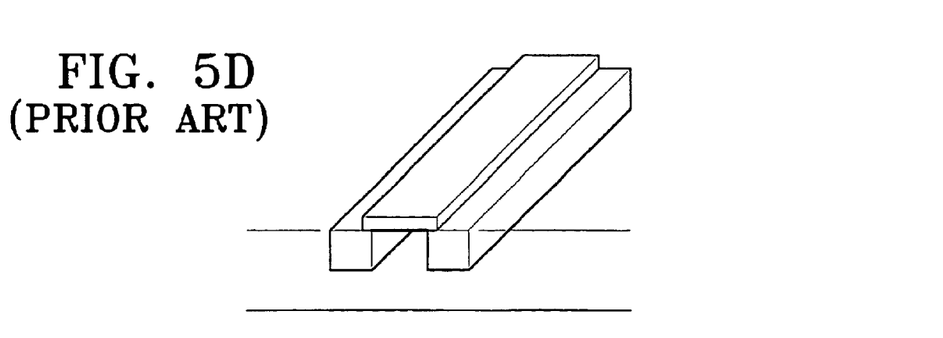

FIG. 5A is a cross-sectioned view for showing a process for forming a PMOS transistor applied to the LSB, FIG. 5D is a cross-sectioned view for showing a process for forming a PMOS transistor applied to the MSB, and FIG. 5B and FIG. 5C are cross-sectioned views for showing a process for forming a PMOS transistor sequentially allocated to the LSB and the MSB, respectively.

As shown in FIGS. 5A, 5B, 5C, and 5D, a conventional MOS transistor has an oxide layer, for example, $SiO_2$ layer, between its drain and source, and varies its turn-on resistance by increasing the width W of the $SiO_2$ layer while keeping the length 'L' of the same constant. Such a process has an advantage of easily varying the turn-on resistance of the PMOS transistor with varying the width W of the $SiO_2$ layer, but has a problem of increasing capacitance forming between the gate (not shown) and drain of a PMOS transistor. The capacitance formed between the gate and drain of the PMOS transistor increases turn-on and turn-off response time in response to a signal applied to the gate of the PMOS transistor, and causes a phenomenon that a signal applied to the gate of the PMOS transistor passes through to the drain of the same when the capacitance becomes large. That is, when such a PMOS transistor is employed in the unit current switch of a digital D/A converter, glitches occur at the output terminal of the D/A converter due to the pass-through phenomenon. Further, since individual PMOS transistors have different response times when the PMOS transistors have different capacitances, the time skew phenomenon occurs due to differences of the response times of the PMOS transistors. Accordingly, a D/A converter having such PMOS transistors causes errors to data values due to the response time differences as it performs D/A conversions at a high speed, and has a problem in performing D/A conversions since a high margin has to be assigned with respect to time interval of sampling in order to compensate for errors due to time skew.

SUMMARY OF THE INVENTION

Accordingly, it is an aspect of the present invention to provide a high speed D/A converter with low skew and glitches.

In order to achieve the above aspect, A digital-to-analog (D/A) converter with low skew and glitch, comprises at least one current cell outputting a different current amount, and a current switch selectively enabling the current cells in response to a digital signal externally supplied. The current switch has at least one MOS transistor having an adjusted aspect ratio so as to have a constant capacitance load regardless of the output current amounts from the current cells, and the D/A converter reduces skew and glitches occurring when the current cells generating different output currents are turned on and off, due to the constant capacitance load.

Preferably, in the MOS transistor, a length L from a source to a drain of the MOS transistor times a width W formed in a vertical direction of the length L is constant regardless of the current capacities of the current cells.

Preferably, a capacitance value is a total sum of parasitic capacitances among gates and sources of the MOS transistor, gates and drains of the MOS transistor, and the gates and a substrate for the MOS transistor.

The current switches each have a turn-on resistance in inverse proportion to the current capacities of the current cells.

Preferably, the D/A converter further comprises a voltage controller for lowering a voltage level turning on and off the current switches to a minimum operation point of the current switches.

Preferably, the current switches alternately operate to form current paths for the current sources between a drive voltage and a ground all the time.

Preferably, the current cells are formed in a thermometer type having the same output current amount.

More preferably, the current cells are divided into at least two or more groups, and designed for the divided groups to have different capacitance loads.

Hereinafter, the present invention will be described in detail with reference to the accompanying drawings.

BRIEF DESCRIPTION OF THE DRAWINGS

The invention will be described in detail with reference to the following drawings in which like reference numerals refer to like elements, and wherein:

FIG. 9A to FIG. 9D are views for comparing output waveforms of a conventional D/A converter and a D/A converter having current switches according to an exemplary embodiment of the present invention.

DETAILED DESCRIPTION OF THE EXEMPLARY EMBODIMENTS

Figure 6:
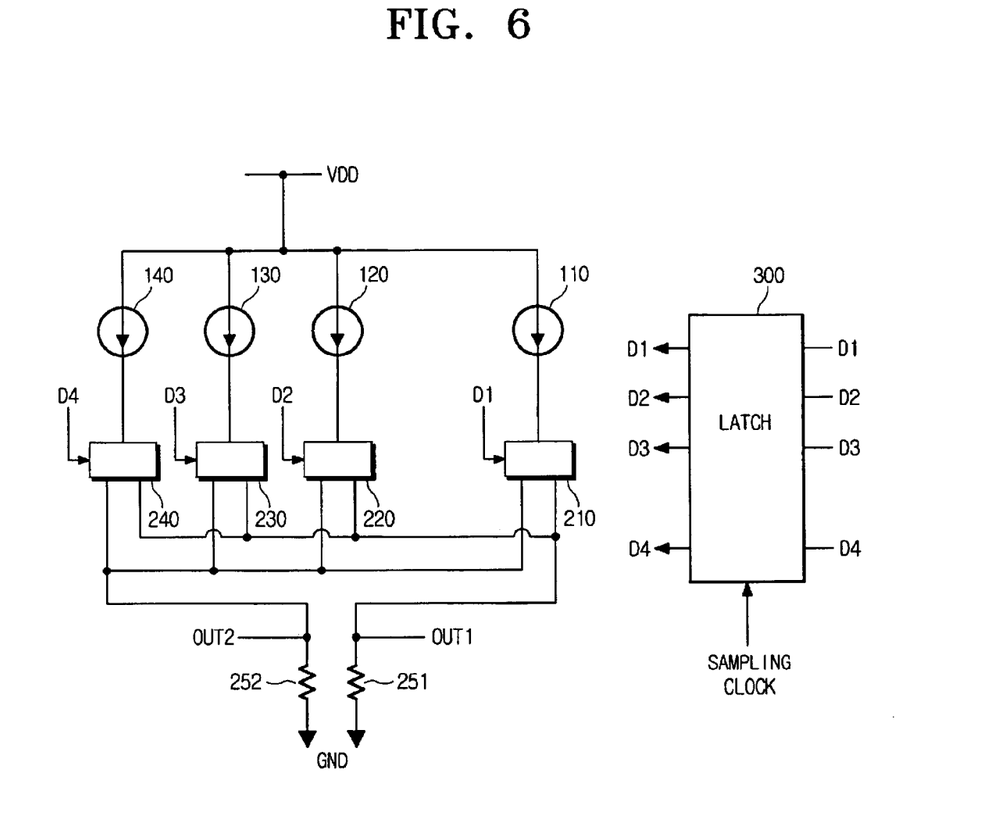
FIG. 6 is a schematic block diagram for conceptually showing a D/A converter according to an exemplary embodiment of the present invention.

FIG. 6 is a schematic block diagram for conceptually showing a D/A converter according to an exemplary embodiment of the present invention.

The D/A converter shown in FIG. 6 is conceptually directed to a 4-bit D/A converter, which has current cells 110, 120, 130, and 140, current switches 210, 220, 230, and 240, load resistors 251 and 252, and a latch 300.

The current cells 110 to 140 are applied with a drive voltage VDD and output predetermined currents. The current cells 110 to 140 each have a different output current based on different weighted values thereof.

The current switches 210 to 240 respond to digital signals D1, D2, D3, and D4 and selectively enable the current cells 110 to 140. That is, the current switches 210 to 240 respond to the digital signals D1 to D4, and differentially output the currents of the current cells 110 to 140 in the inverse or non-inverse fashions. Accordingly, the current outputs of the current cells 110 to 140 form current paths all the time between the drive voltage VDD and the ground GND. By keeping the current cells 110 to 140 electrically conducted by the current switches 210 to 240, the number of glitches occurring when a D/A converter performs D/A conversions is reduced.

The latch 300 matches the time when a digital signal is applied to the individual current switches 210 to 240 with a sampling clock.

The load resistors 251 and 252 convert into a voltage value the total sum of currents applied from the current sources selectively conducted by the current switches 210 to 240.

Figure 7:
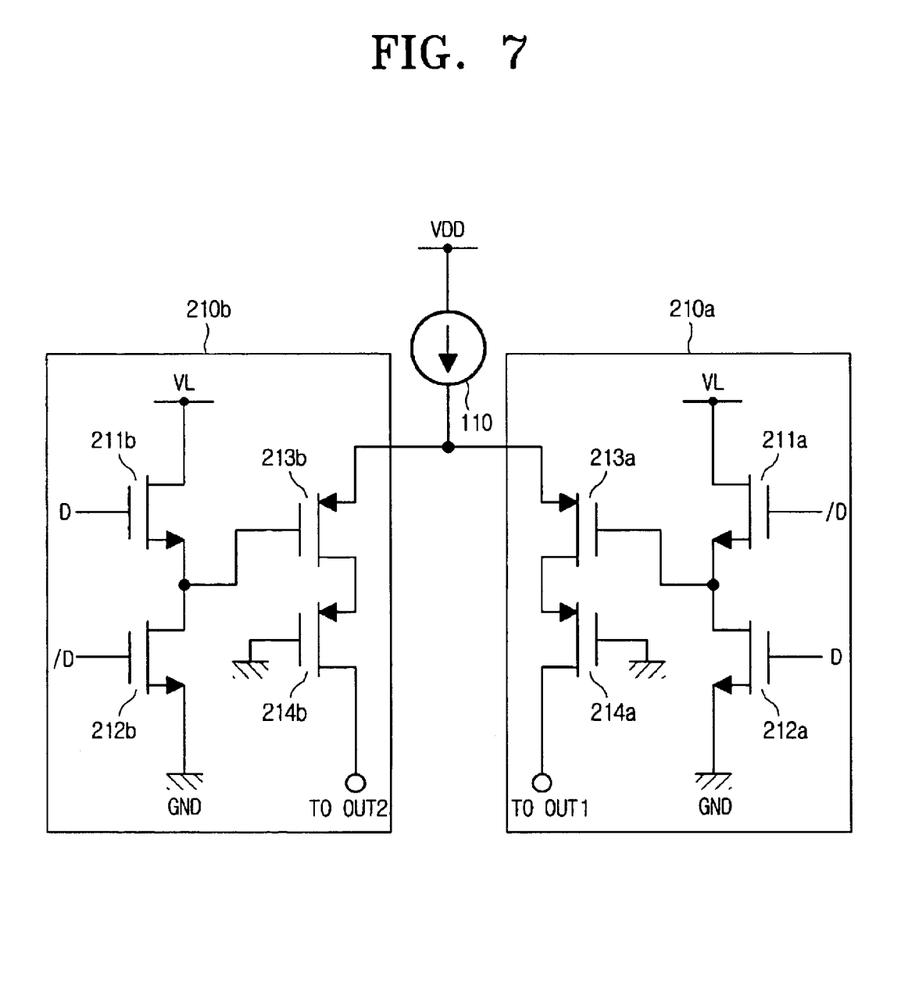
FIG. 7 is a detailed view for showing one of the current switches shown in FIG. 6.

FIG. 7 is a detailed circuit for showing one of the current switches 210 to 240 shown in FIG. 6.

The current switch shown in FIG. 7 differentially operates with a digital signal D and an inverted digital signal /D. When the digital signal D is in logic "high", an NMOS transistor 212a is turned on to apply the ground voltage GND to the gate of a PMOS transistor 213a. Accordingly, the PMOS transistor 213a provide a current path between the current source 110 and an output terminal out1.

When the digital signal D is in logic "low", an NMOS transistor 212b is turned on to apply the ground voltage GND to the gate of the PMOS transistor 213b. Accordingly, the PMOS transistor 213b is turned on to provide a current path between the current source 110 and an output terminal out2. The current switch according to an embodiment of the present invention features the PMOS transistors 213a and 213b shown in FIG. 7. Each of the PMOS transistors 213a and 213b has a certain capacitance between its gate and source regardless of an output current amount of the current source 110 by adjusting a length-to-width ratio of an oxide layer, for example, $SiO_2$ layer, provided between the gate and source in a MOS transistor design step, that is, in a process step. With a capacitance of constant value as above, a D/A converter to which the current switch is applied has an effect of reduced skew and glitches, regardless of an output current amount of each current cell, which will be later described in detail.

Figure 8A:
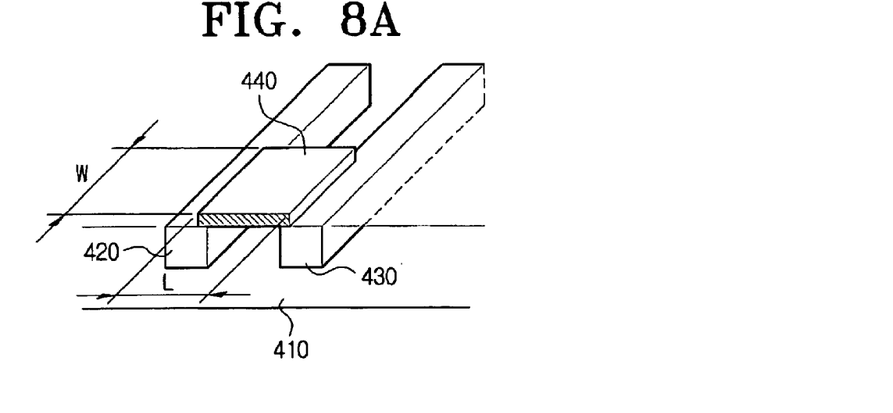
FIG. 8A to FIG. 8D are views for showing a process for a PMOS transistor shown in FIG. 7.

FIG. 8A is a cross-sectioned view for showing a process for the PMOS transistor 213a or 213b shown in FIG. 7.

A reference numeral 410 denotes an n-well for forming channels upon implanting a PMOS transistor on a P-type substrate. A reference numeral 420 denotes a source formed in the n-well. A reference numeral 430 denotes a drain formed in the n-well. A reference numeral 440 denotes an oxide, for example, $SiO_2$, formed between the source 420 and the drain 430. Even though not shown in FIG. 7, metal is deposited on the oxide layer to form a gate.

In the meantime, capacitance formed between the gate (not shown) and the source 420 is determined depending upon an area of the oxide layer, such as an $SiO_2$ layer functioning as a dielectric layer. For example, the PMOS transistor shown in FIG. 8A has a parasitic capacitance formed in proportion to a width W times a length L, which can be expressed in Equation 1 as follows:

$$C(\text{total}) \cong C_{gs} = K \cdot (W \times L) \qquad \text{[Equation 1]}$$

C(total) denotes the total sum of parasitic capacitance formed in a PMOS transistor, Cgs a parasitic capacitance between a gate and a source of the PMOS transistor, W and L each denotes a width and a length of an oxide layer, respectively, and K denotes a proportional constant. The Equation 1 replaces with the total sum of parasitic capacitance the Cgs most affecting glitches and skew out of the parasitic capacitances.

Further, a turn-on resistance of a PMOS transistor can be expressed in Equation 2 as follows:

$$R_{on} = \mu \cdot C_{ox} \cdot (V_{gs} - V_{th} - V_d) \cdot \left(\frac{L}{W}\right) = K \cdot \left(\frac{L}{W}\right) \qquad \text{[Equation 2]}$$

$\mu$ denotes a hole movement speed, Cox a unit capacitance of an oxide layer, W and L each a width and a length of the oxide layer, respectively, Vgs a voltage between a gate and a source, $V_{th}$ a threshold voltage, and K a proportional constant.

That is, the turn-on resistance becomes smaller as the width W of an oxide layer 440 disposed between the source 420 and the drain 430 becomes wider, whereas the turn-on resistance becomes larger as the length L of the oxide layer becomes longer.

FIG. 8B to FIG. 8E are views for showing a process for a PMOS transistor provided in unit current switches, for example, reference numerals 210 to 240, upon applying the PMOS transistor for example, a reference numeral 213a or 213b, of the unit current switch shown in FIG. 8A to the current switch shown in FIG. 7.

Figure 8B:
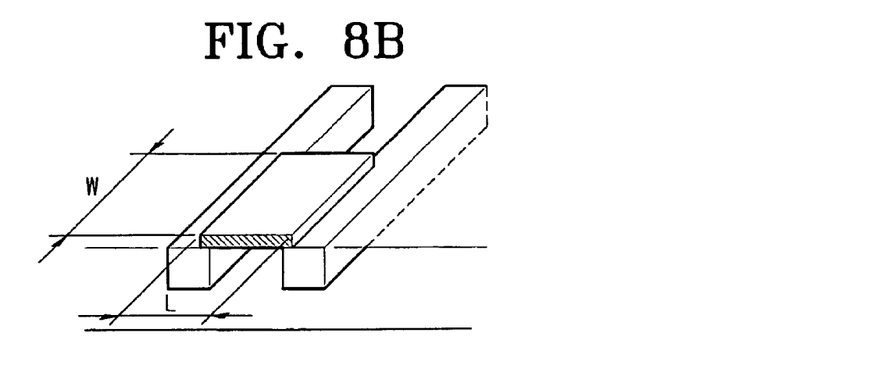

FIG. 8B is a cross-sectioned view for showing a process for a PMOS transistor applied to the current switch 240 corresponding to the first bit, that is, the Least Significant Bit (LSB), out of the current switches shown in FIG. 6. The PMOS transistor shown in FIG. 8B is formed in a width W of 25 $\mu$m and a length L of 2 $\mu$m. Accordingly, the width W times length L becomes 50 $\mu$m2, and the turn-on resistance becomes 0.08×K (proportional constant) based on Equation 2.

Figure 8C:
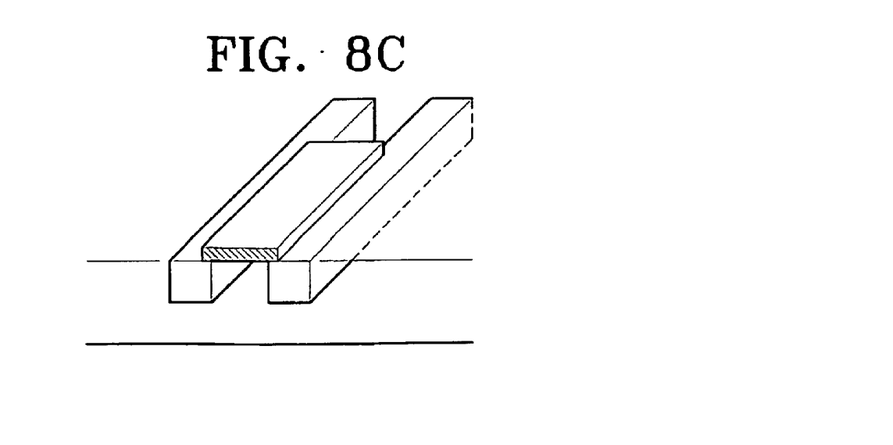

FIG. 8C is a cross-sectioned view for showing a process for a PMOS transistor applied to the current switch 230 corresponding to the second bit out of current switches shown in FIG. 6. The PMOS transistor shown in FIG. 8C is formed in a width W of 35.4 μm and a length L of 1.4 μm. Accordingly, the width W times length L becomes 49.6 μm², the turn-on resistance becomes 0.04×K (proportional constant) based on Equation 2.

Figure 8D:
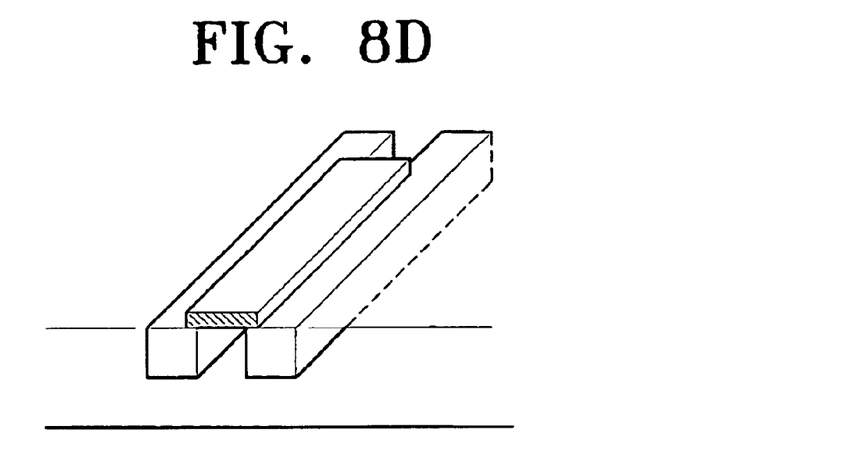

FIG. 8D is a cross-sectioned view for showing a process for a PMOS transistor applied to the current switch 220 corresponding to the third bit out of the current switches shown in FIG. 6. The PMOS transistor shown in FIG. 8D is formed in a width W of 50 μm and a length L of 1 μm. Accordingly, the width W times length L becomes 50 μm², and the turn-on resistance becomes 0.02×K (proportional constant) based on Equation 2.

Figure 8E:
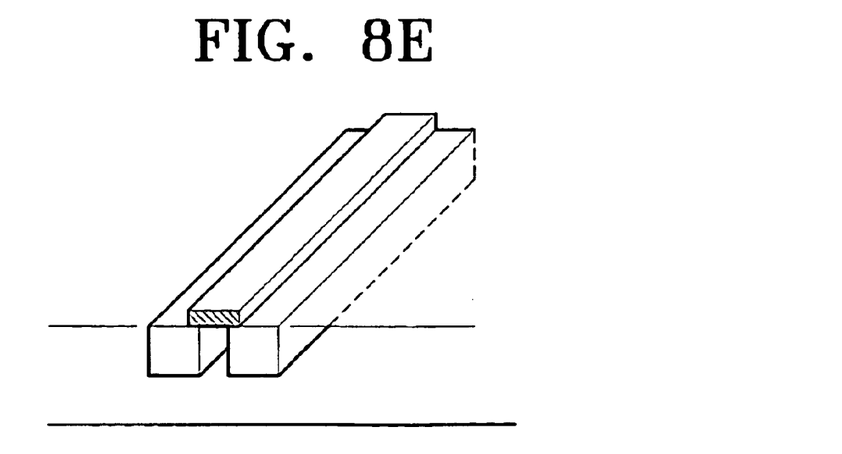

FIG. 8E is a cross-sectioned view for showing a process for a PMOS transistor applied to the current switch 210 corresponding to the fourth bit, that is, the Most Significant Bit, out of the current switches shown in FIG. 6.

The PMOS transistor shown in FIG. 8E is formed in a width W of 70.7 μm and a length L of 0.71 μm. Accordingly, the width W times length L becomes 50.2 μm², and the turn-on resistance becomes 0.01×K (proportional constant) based on Equation 2.

The width W times length L of each of the oxide layers of the PMOS transistors shown in FIGS. 8B, 8C, 8D, and 8E has a constant value (about 50 μm²) all the time, so that, when a n-bit D/A converter is constructed with the current switches to which such PMOS transistors are applied, the individual current switches for converting bits have the same capacitance value. Accordingly, the individual current switches corresponding to bits have the same response time regardless of the output current amounts of current sources, to thereby reduce skew, enabling a D/A converter having the current switches to which the PMOS transistors are applied to operate at a high speed.

Further, the width W times length L of the oxide layers of the PMOS transistors shown in FIGS. 8B, 8C, 8D, and 8E becomes constant all the time, but the PMOS transistors each have a different turn-on resistance. For example, the current switch for the least significant bit having the smallest current output amount has the turn-on resistance of 0.08×K, whereas the current switch for the most significant bit having the most current output amount has the turn-on resistance of 0.01×K, so that response time delays depending up current output amounts do not occur.

Figure 9A:
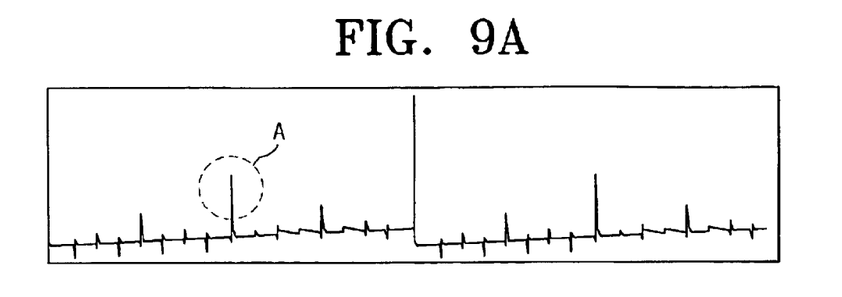
Figure 9B:
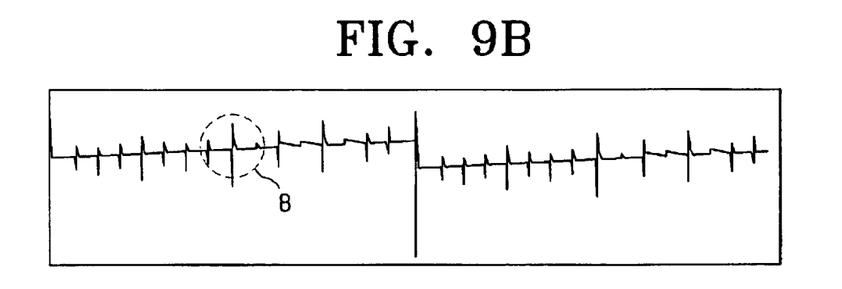
Figure 9C:
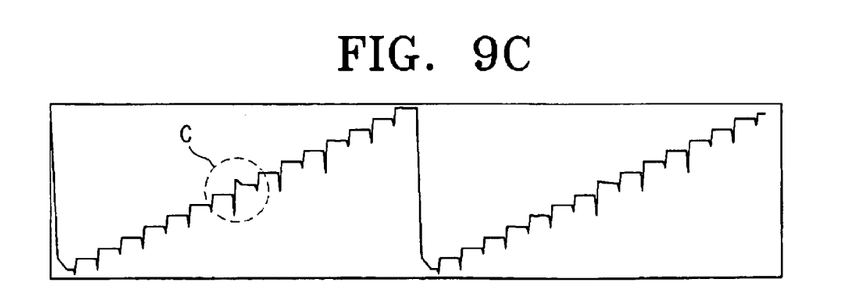

FIGS. 9A, 9B, and 9C are views for comparing output waveforms of a conventional D/A converter and a D/A converter having the current switches according to present invention.

FIG. 9A is a view for showing the output waveforms of the D/A converter to which the current switches shown in FIG. 3A are applied, FIG. 9B is a view for showing the output waveforms of the D/A converter to which the current switches shown in FIG. 3B are applied, and FIG. 9C is a view for showing the output waveforms of the D/A converter to which the current switches according to the present invention are applied.

As shown in FIGS. 9A, 9B, and 9C, it can be seen that the glitch in a region C of an output waveform of the D/A converter to which the current switches according to the present invention are applied is very small in its occurrence frequency or size compared to the conventional D/A converters, that is, compared to the glitches in regions A and B of FIG. 9A and FIG. 9B. This is because the current switches according to the present invention having constant parasitic capacitance regardless of output current amounts solve the problem of causing skew and glitches on digital signals D1 to D4 for driving current cells due to capacitance values becoming larger as the conventional current switches operate with higher bits. Further, the current switches according to the present invention keep a capacitance value constant regardless of their output current amounts of current sources, to thereby reduce glitches occurring due to feed-through currents from the gates to the sources of PMOS transistors corresponding to upper bits causing large output current amounts.

This is because the current switches according to the present invention having constant parasitic capacitance regardless of their output current amounts solve the problem of glitches occurring due to feed-through currents from the gates to the sources of the PMOS transistors.

Figure 10:
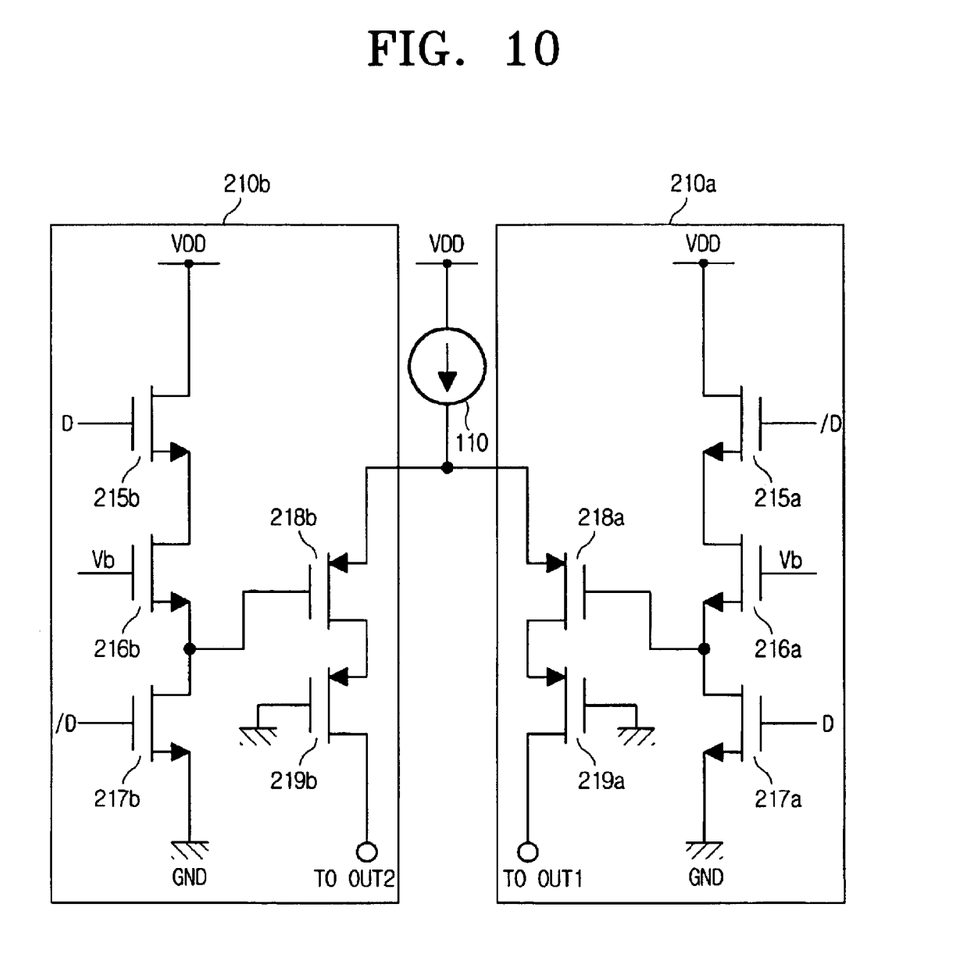
FIG. 10 is a view for showing one of the current switches shown in FIG. 6 according to another exemplary embodiment of the present invention.

FIG. 10 is a view for showing one of the current switches 210 to 240 shown in FIG. 6 according to an exemplary embodiment of the present invention. The shown embodiment is a current switch to which the PMOS transistors shown in FIGS. 8B to 8E are applied, which has similar structure and operations to the current switch shown in FIG. 7, so like reference numerals are referred to for like elements and the descriptions of like elements will be partially omitted.

The current switch shown in FIG. 10 has a first switching part 210a and a second switching part 210b.

The first switching part 210a has NMOS transistors 215a, 216a, and 217a connected in series between the drive voltage VDD and the ground GND and respectively responding to the inverse digital signal /D, a control voltage Vb, and a digital signal D, a PMOS transistor 218a, the source of which is connected to an output terminal of a current source and the gate of which is connected to the drain of the NMOS transistor 217a, and a PMOS transistor 219a the source of which is connected to the drain of the PMOS transistor 218a and the gate of which is connected to the ground GND, and the drain of which forms a first output terminal out1.

The first switching part 210a turns on the NMOS transistor 217a to connect the gate of the PMOS transistor 218a to the ground GND when the digital signal D is in logic "high". Accordingly, the PMOS transistor 218a provides a current path between the current source 110 and the output terminal out1. At this time, as the control voltage Vb applied to the gate of the NMOS transistor 216a varies, a voltage induced to the source of the NMOS transistor 216a is increased or decreased. For example, in case that a voltage of 3V is applied to the gate of the NMOS transistor 216b, the maximum voltage induced to the source of the NMOS transistor 216b becomes about 2V. That is, an absolute voltage value of a glitch occurring upon turning off the PMOS transistor 218a can be reduced. The PMOS transistor 218a is applied with an aspect ratio as described in FIGS. 8B to 8E.

The second switching part 210b has similar structure and operations to the first switching part 210a, so descriptions of which will be omitted.

Figure 11A:
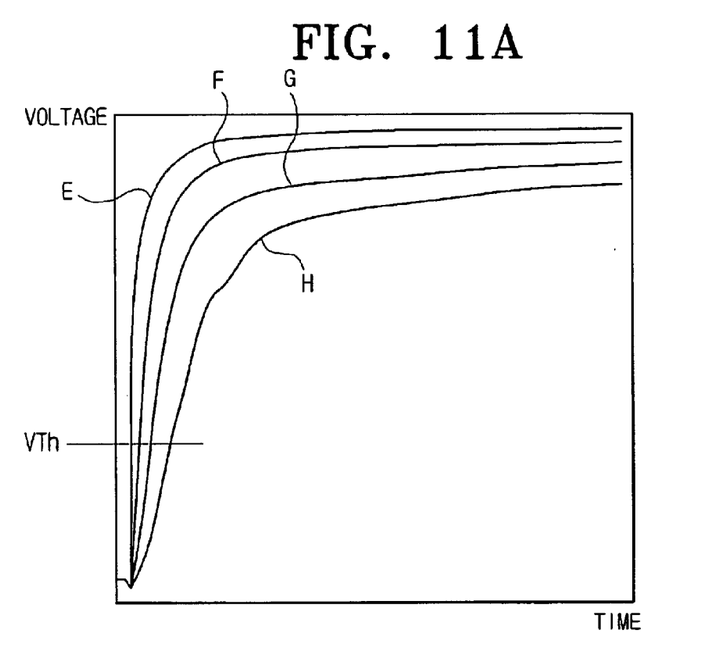
FIG. 11A and FIG. 11B are views for comparing response characteristics of the conventional current switch and the current switch provided with MOS transistors each having an adjusted aspect ratio according to the present invention.
Figure 11B:
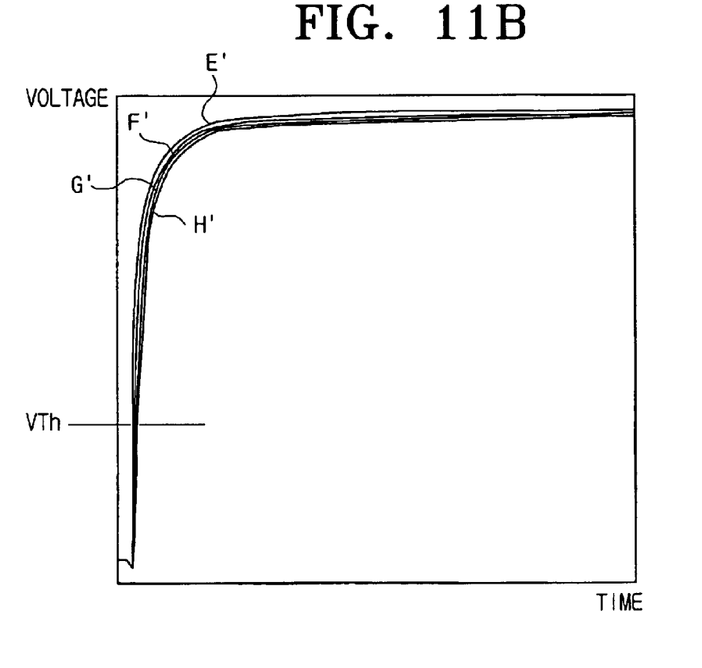

FIG. 11A and FIG. 11B are views for comparing response characteristics of the conventional current switch and the current switch provided with MOS transistors each having an adjusted aspect ratio according to the present invention.

FIG. 11A is a view for showing response curves by bit in the current switch shown in FIG. 4.

A reference numeral E denotes a response curve of the current switch for the first bit (LSB) generating the smallest output current amount, a reference numeral F denotes a response curve of the current switch for the second bit, a reference numeral G denotes a response curve of the current switch for the third bit, a reference numeral H denotes a response curve of the current switch for the fourth bit (MSB), and a reference numeral Vth denotes a threshold voltage of a PMOS transistor.

As shown in FIG. 11A, it can be seen that the reference numeral E with the smallest output current amount has the fastest response speed with reference to the threshold voltage of the PMOS transistor and the reference numeral H with the largest output current amount has the slowest response speed.

FIG. 11B is a view for showing response curves of the current switch provided with PMOS transistors each having an adjusted aspect ratio according to the present invention.

As described above, since a constant capacitance is formed in the current switches corresponding to current sources due to the PMOS transistors each having an adjusted aspect ratio according to the present invention, it can be seen that response curves E', F', G', and H' corresponding to each of the bits have nearly identical response characteristics, respectively.

It can be considered that the same response speed is obtained with reference to the threshold voltage $V_{th}$, and such response characteristics prevent data errors when D/A conversions are performed at a high speed, and there is no need to increase a timing margin in consideration of a response time for each bit.

In the meantime, the PMOS transistors according to the present invention enable a glitch and skew-reducing effect to be obtained when applied to a thermometer-type D/A converter and a combination-type D/A converter to which the thermometer-type D/A converter is partially applied, in addition to a conventional D/A converter.

The thermometer-type refers to a D/A converter that has the same output current amount from all the current sources provided in a D/A converter, and performs D/A conversions by adding or subtracting the number of current sources turned on in proportion to a weighted value of a digital signal. Accordingly, the thermometer type is characterized in that the current sources each have a constant parasitic capacitance value, but the thermometer type D/A converter needs more current sources compared to a general D/A converter upon performing D/A conversions. The combination-type D/A conversion method refers to a D/A conversion method that divides N number of current sources into two groups, applies to one of the divided groups a conventional D/A conversion method, and applies the thermometer type D/A conversion method to the other group. The glitch- and skew-reducing effect can be obtained when the current switches each having the PMOS transistors according to the present invention are applied to the current sources of the group to which weighted values are applied, in the D/A converter applied with the combination-type D/A conversion method.

As described, the present invention adjusts parasitic capacitances of MOS transistors provided in the current switch to become constant regardless of output current amounts, so that a D/A converter capable of operating at a high speed with low skew and glitch is implemented.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A digital-to-analog (D/A) converter with low skew and glitch, comprising:
    at least one current cell outputting a different current amount; and
    a current switch selectively enabling the at least one current cell in response to a digital signal externally supplied, the current switch having at least one MOS transistor having an adjusted aspect ratio so as to have a constant capacitance load regardless of the output current amounts from the at least one current cell,
    wherein the D/A converter reduces skew and glitches occurring when the at least one current cell generating different output currents is turned on and off, due to the constant capacitance load.

2. The D/A converter as claimed in claim 1, wherein, in the at least one MOS transistor, a length L from a source to a drain of the MOS transistor times a width W formed in a vertical direction of the length L is constant regardless of the current capacities of the at least one current cell.

3. The D/A converter as claimed in claim 2, wherein a capacitance value is a total sum of parasitic capacitances among gates and sources of the at least one MOS transistor, the gates and drains of the at least one MOS transistor, and the gates and a substrate for the at least one MOS transistor.

4. The D/A converter as claimed in claim 1, wherein the current switches each have a turn-on resistance in inverse proportion to the current capacities of the at least one current cell.

5. The D/A converter as claimed in claim 1, further comprising a voltage controller for lowering a voltage level turning on and off the current switch to a minimum operation point of the current switch.

6. The D/A converter as claimed in claim 1, wherein the current switch alternately operates to form current paths for current sources between a drive voltage and a ground all the time.

7. The D/A converter as claimed in claim 1, wherein the at least one current cell is divided into at least two or more groups, and designed for one of the divided groups to have the same output current amount according to a thermometer type.

* * * * *